United States Patent
Deng et al.

(10) Patent No.: US 12,232,272 B2
(45) Date of Patent: Feb. 18, 2025

(54) BENDING APPARATUS, DEVICE TO BE BENT AND MACHINING METHOD THEREFOR, BENT DEVICE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tianjun Deng, Beijing (CN); Xiaolong Tang, Beijing (CN); Shaopeng Li, Beijing (CN); Weiben Zhang, Beijing (CN); Rongkun Fan, Beijing (CN); Wenze LI, Beijing (CN); Xinfeng Zhou, Beijing (CN); Junhao Ai, Beijing (CN); Cheng Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 204 days.

(21) Appl. No.: 17/927,429

(22) PCT Filed: Nov. 16, 2021

(86) PCT No.: PCT/CN2021/130785
§ 371 (c)(1),
(2) Date: Nov. 23, 2022

(87) PCT Pub. No.: WO2022/160870
PCT Pub. Date: Aug. 4, 2022

(65) Prior Publication Data
US 2023/0225057 A1  Jul. 13, 2023

(30) Foreign Application Priority Data
Jan. 27, 2021 (CN) .......................... 202120230454.3

(51) Int. Cl.
*H05K 1/02* (2006.01)
*H05K 3/00* (2006.01)

(52) U.S. Cl.
CPC ........... *H05K 3/0014* (2013.01); *H05K 1/028* (2013.01); *H05K 2201/055* (2013.01); *H05K 2201/10128* (2013.01); *H05K 2203/30* (2013.01)

(58) Field of Classification Search
CPC ............... H05K 3/0014; H05K 1/028; H05K 2201/055; H05K 2201/10128; H05K 2203/30
See application file for complete search history.

(56) References Cited

U.S. PATENT DOCUMENTS 10,204,549 B1 * 2/2019 Byeon ................. G09G 3/3266
2004/0017536 A1 * 1/2004 Takenaka ............ G02F 1/13452
349/150

(Continued)

FOREIGN PATENT DOCUMENTS

CN 204330977 U 5/2015
CN 105825773 A 8/2016

(Continued)

OTHER PUBLICATIONS

First Office Action for Chinese Patent Application No. 202120230454.3 issued by the Chinese Patent Office on Jul. 23, 2021.

*Primary Examiner* — Binh B Tran
(74) *Attorney, Agent, or Firm* — IP & T GROUP LLP

(57) ABSTRACT

A bending apparatus includes a fixing structure, a first driving mechanism, a first pressing head connected to the first driving mechanism, a second driving mechanism and a second pressing head connected to the second driving mechanism. The first driving mechanism is configured to drive the first pressing head to move onto a first surface of a first portion, and to drive the first pressing head to push the first portion to rotate to a first side of a body portion, so that the first portion is parallel or substantially parallel to the body portion. The second driving mechanism is configured (Continued)

to drive the second pressing head to move onto a second surface of a second portion, and is further configured to drive the second pressing head to pull the second portion to rotate to the first side of the body portion while the first pressing head pushes the first portion.

19 Claims, 11 Drawing Sheets

(56) References Cited

U.S. PATENT DOCUMENTS

| | | |
|---|---|---|
| 2009/0237588 A1 | 9/2009 | Takenaka et al. |
| 2016/0219723 A1 | 7/2016 | Jung et al. |
| 2018/0063942 A1 | 3/2018 | Kim et al. |
| 2019/0204651 A1 | 7/2019 | Bai et al. |
| 2020/0020720 A1 | 1/2020 | Kim |

FOREIGN PATENT DOCUMENTS

| | | | |
|---|---|---|---|
| CN | 107484328 A | 12/2017 | |
| CN | 206701992 U | 12/2017 | |
| CN | 107799929 A | 3/2018 | |
| CN | 108008584 A | 5/2018 | |
| CN | 108123071 A | 6/2018 | |
| CN | 109272871 A | 1/2019 | |
| CN | 110767089 A | 2/2020 | |
| CN | 110780475 A | 2/2020 | |
| CN | 210381491 U | 4/2020 | |
| CN | 111128020 A | 5/2020 | |
| CN | 211102542 U | 7/2020 | |
| KR | 10-2020-0006644 A | 1/2020 | |

\* cited by examiner

BENDING APPARATUS, DEVICE TO BE BENT AND MACHINING METHOD THEREFOR, BENT DEVICE, AND DISPLAY DEVICE

CROSS-REFERENCE TO RELATED APPLICATIONS

This application is a national phase entry under 35 USC 371 of International Patent Application No. PCT/CN 2021/130785 filed on Nov. 16, 2021, which claims priority to Chinese Patent Application No. 202120230454.3, filed on Jan. 27, 2021, which are incorporated herein by reference in their entirety.

TECHNICAL FIELD

The present disclosure relates to the field of display technologies, and in particular, to a bending apparatus, a device to be bent, a method of machining the device to be bent by using the bending apparatus, a bent device, and a display device.

BACKGROUND

A display device mainly includes a display module. The display module mainly includes a display panel and a flexible printed circuit. After an end of the flexible printed circuit is bonded to the display panel, it is necessary to bend a portion of the flexible printed circuit away from the display panel to a back of the display panel by using a bending apparatus, so as to reduce a bezel of the display device.

SUMMARY

In an aspect, a bending apparatus is provided. The bending apparatus is used for machining a device to be bent. The device to be bent includes a body portion and a portion to be bent connected to each other, and the portion to be bent includes a first portion and a second portion that are away from the body portion in sequence. The bending apparatus includes a fixing structure, a first driving mechanism, a first pressing head connected to the first driving mechanism, a second driving mechanism and a second pressing head connected to the second driving mechanism. The fixing structure is configured to fix the body portion of the device to be bent. The first driving mechanism is configured to drive the first pressing head to move onto a first surface of the first portion, and to drive the first pressing head to push the first portion to rotate to a first side of the body portion, so that the first portion is parallel or substantially parallel to the body portion. The second drive mechanism is configured to drive the second pressing head to move onto a second surface of the second portion. The second surface and the first surface are respectively located on two sides of the portion to be bent. The second driving mechanism is further configured to drive the second pressing head to pull the second portion to rotate to the first side of the body portion while the first pressing head pushes the first portion.

In some embodiments, the second driving mechanism is further configured to drive the second pressing head to pull the second portion to rotate to the first side of the body portion while the first pressing head pushes the first portion, so that the second portion is perpendicular or substantially perpendicular to the body portion.

In some embodiments, the first driving mechanism is further configured to drive the first pressing head to move away from the first portion after the first portion is parallel or substantially parallel to the body portion.

In some embodiments, the second driving mechanism is further configured to drive the second pressing head to push the second portion to rotate to a side of the first portion away from the body portion after the first pressing head moves away from the first portion, so that the second portion is parallel or substantially parallel to the first portion.

In some embodiments, the first pressing head includes a first adsorption plate and a first vacuum pumping device. At least one first vacuum pumping hole is disposed in the first adsorption plate, and the first vacuum pumping device is communicated with the at least one first vacuum pumping hole. In some embodiments, the second pressing head includes a second adsorption plate and a second vacuum pumping device. At least one second vacuum pumping hole is disposed in the second adsorption plate, and the second vacuum pumping device is communicated with the at least one second vacuum pumping hole.

In some embodiments, the first pressing head further includes a first pressing plate and a first cylinder. The first cylinder is connected to the first pressing plate. The first cylinder is configured to drive the first pressing plate to move towards or away from the first portion. The device to be bent further includes a first adhesive layer located on a surface of the body portion at the first side. When the first pressing head stops pushing the first portion, and before the first pressing head moves away from the first portion, the first pressing plate is located on a side of the first portion away from the first adhesive layer. An orthographic projection of the first pressing plate on the body portion is at least partially overlapped with an orthographic projection of the first adhesive layer on the body portion. The first cylinder is configured to drive the first pressing plate to move towards the first portion, so that the first portion is adhered to the body portion through the first adhesive layer. In some embodiments, the second pressing head further includes a second pressing plate and a second cylinder. The second cylinder is connected to the second pressing plate. The second cylinder is configured to drive the second pressing plate to move towards or away from the second portion. The device to be bent further includes a second adhesive layer located on a first surface of the second portion. When the second pressing head stops pushing the second portion, and before the second pressing head moves away from the second portion, the second pressing plate is located on a side of the second portion away from the second adhesive layer. An orthographic projection of the second pressing plate on the body portion is at least partially overlapped with an orthographic projection of the second adhesive layer on the body portion. The second cylinder is configured to drive the second pressing plate to move towards the second portion, so that the second portion is adhered to the first portion through the second adhesive layer.

In some embodiments, the first driving mechanism includes: a first base; a first Y-axis movement mechanism disposed on the first base and including a first support structure capable of moving in a Y-axis direction relative to the first base; a first Z-axis movement mechanism disposed on the first support structure and including a second support structure capable of moving in a Z-axis direction relative to the first support structure: a first X-axis rotation mechanism disposed on the second support structure and including a first rotation structure capable of rotating about a rotation axis of the first rotation structure parallel to an X-axis direction relative to the second support structure; and a first rotation arm. An end of the first rotation arm is connected to the first rotation structure, and another end of the first rotation arm is connected to the first pressing head. The first rotation arm is parallel to the rotation axis of the first rotation structure, and an axis of the first rotation arm and the rotation axis of the first rotation structure have a first preset distance therebetween. In some embodiments, the second driving mechanism includes: a second base; a second Y-axis movement mechanism disposed on the second base and including a third support structure capable of moving in the Y-axis direction relative to the second base; a second Z-axis movement mechanism disposed on the third support structure and including a fourth support structure capable of moving in the Z-axis direction relative to the third support structure; a second X-axis rotation mechanism disposed on the fourth support structure and including a second rotation structure capable of rotating about a rotation axis of the second rotation structure parallel to the X-axis direction relative to the fourth support structure; and a second rotation arm. An end of the second rotation arm is connected to the second rotation structure, and another end of the second rotation arm is connected to the second pressing head. The second rotation arm is parallel to the rotation axis of the second rotation structure, and an axis of the second rotation arm and the rotation axis of the second rotation structure have a second preset distance therebetween.

In some embodiments, the first rotation structure and the second rotation structure are respectively located on two opposite sides of the fixing structure in the X-axis direction. The first rotation arm extends to a side of the second rotation structure proximate to the fixing structure, and the second rotation arm extends to a side of the first rotation structure proximate to the fixing structure.

In some embodiments, the X-axis direction, the Y-axis direction and the Z-axis direction are perpendicular to each other, and the X-axis direction and the Y-axis direction are parallel to a horizontal plane.

In some embodiments, the fixing structure includes a carrier plate and a third vacuum pumping device. A plurality of vacuum pumping holes are disposed in the carrier plate. The third vacuum pumping device is communicated with the plurality of vacuum pumping holes.

In some embodiments, the bending apparatus further includes a third driving mechanism. The third driving mechanism includes a third base and a third Y-axis movement mechanism disposed on the third base. The third Y-axis movement mechanism includes a fifth support structure capable of moving in a Y-axis direction relative to the third base. The carrier plate is disposed on the fifth support structure.

In some embodiments, the bending apparatus further includes at least one blower disposed on the third base. The at least one blower is configured to, before the first pressing head moves to the first surface of the first portion, and before the second pressing head moves to the second surface of the second portion, blow air to the portion to be bent, so that the portion to be bent and the body portion are located in a same plane or substantially in the same plane.

In some embodiments, the bending apparatus further includes at least one support rod connected to the carrier plate. The at least one support rod is configured to, before the first pressing head moves to the first surface of the first portion, and before the second pressing head moves to the second surface of the second portion, support the portion to be bent, so that the portion to be bent and the body portion are located in a same plane or substantially in the same plane.

In another aspect, a device to be bent is provided. The device to be bent is a display module to be bent. The display module to be bent includes a display panel, a COF circuit board, a printed circuit board, a flexible printed circuit and a clock control circuit board. An end of the COF circuit board is bonded to the display panel. An end of the printed circuit board is bonded to another end of the COF circuit board. An end of the flexible printed circuit is bonded to another end of the printed circuit board. An end of the clock control circuit board is bonded to another end of the flexible printed circuit. The display panel is the body portion of the device to be bent, the printed circuit board is the first portion of the device to be bent, and the flexible printed circuit is the second portion of the device to be bent.

In yet another aspect, a method of machining the device to be bent by using the bending apparatus in any one of the above embodiments is provided. The machining method includes: fixing, by the fixing structure of the bending apparatus, the body portion of the device to be bent; driving, by the first driving mechanism of the bending apparatus, the first pressing head to move onto the first surface of the first portion, and driving, by the second driving mechanism of the bending apparatus, the second pressing head to move onto the second surface of the second portion, the second surface and the first surface being respectively located on the two sides of the portion to be bent; and driving, by the first driving mechanism, the first pressing head to push the first portion to rotate to the first side of the body portion, so that the first portion is parallel or substantially parallel to the body portion, and at the same time, driving, by the second driving mechanism, the second pressing head to pull the second portion to rotate to the first side of the body portion.

In some embodiments, the machining method further includes: driving, by the first driving mechanism, the first pressing head to move away from the first portion; and pushing, by the second driving mechanism, the second portion to rotate to the side of the first portion away from the body portion after the first pressing head moves away from the first portion, so that the second portion is parallel or substantially parallel to the first portion.

In some embodiments, the device to be bent further includes a first adhesive layer located on a surface of the body portion at the first side. The machining method further includes: after the first pressing head stops pushing the first portion, and before the first pressing head moves away from the first surface of the first portion, pressing, by the first pressing head, the first portion to adhere the first portion to the body portion through the first adhesive layer. In some embodiments, the device to be bent further includes a second adhesive layer located on a first surface of the second portion. The machining method further includes: after the second pressing head stops pushing the second portion, and before the second pressing head moves away from the second surface of the second portion, pressing, by the second pressing head, the second portion to adhere the second portion to the first portion through the second adhesive layer.

In yet another aspect, a bent device is provided. The bent device is machined by the machining method in any one of the above embodiments.

In some embodiments, the bent device is a bent display module. The bent display module includes a display panel, a COF circuit board, a printed circuit board, a flexible printed circuit and a clock control circuit board. An end of the COF circuit board is bonded to the display panel. An end of the printed circuit board is bonded to another end of the COF circuit board. An end of the flexible printed circuit is bonded to another end of the printed circuit board. An end of the clock control circuit board is bonded to another end of the flexible printed circuit. The display panel is the body portion of the device to be bent, the printed circuit board is the first portion of the device to be bent, and the flexible printed circuit is the second portion of the device to be bent. The first portion is parallel or substantially parallel to the display panel, and the second portion is parallel or substantially parallel to the first portion.

In yet another aspect, a display device is provided. The display device includes the bent device in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
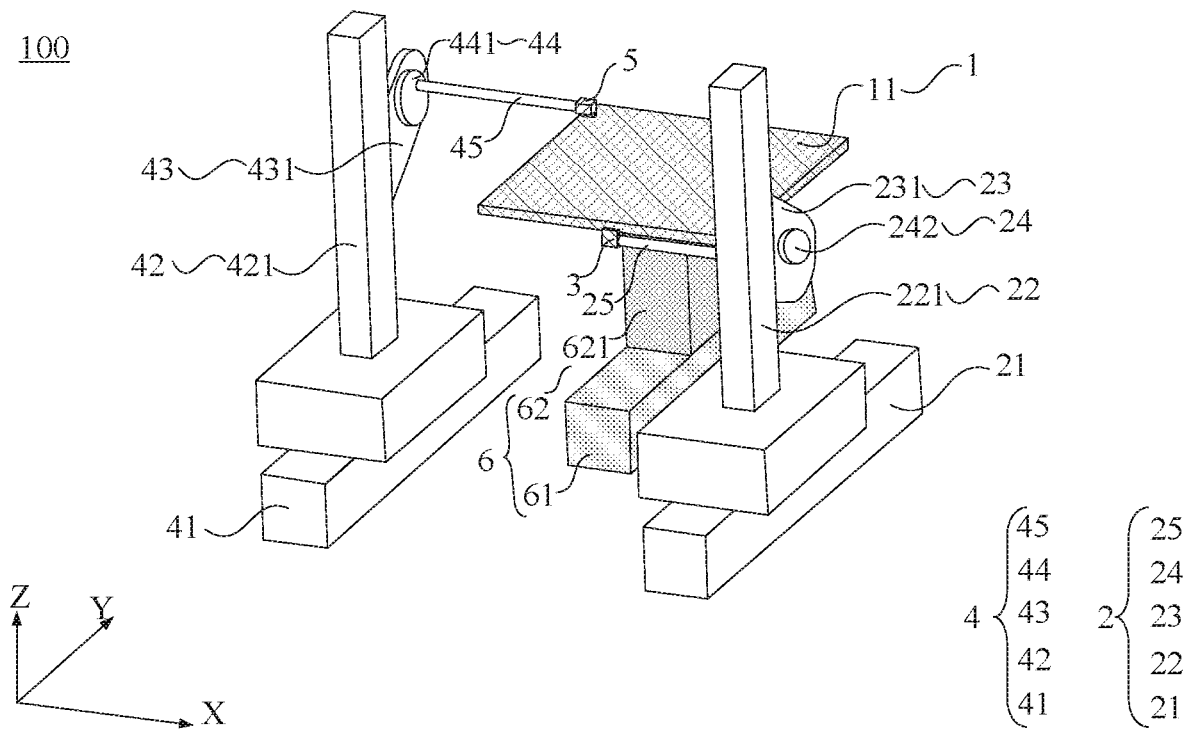
FIG. 1 is structural diagram of a bending apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the display module in the related art, it is necessary to bend the portion of the flexible printed circuit away from the display panel to the back of the display panel by using the bending apparatus, so as to reduce the bezel of the display device. However, when the bending apparatus in the related art bends the portion of the flexible printed circuit away from the display panel to the back of the display panel, the flexible printed circuit is attached to the back of the display panel, so that the flexible printed circuit is difficult to be bent for a second time.

Figure 2:
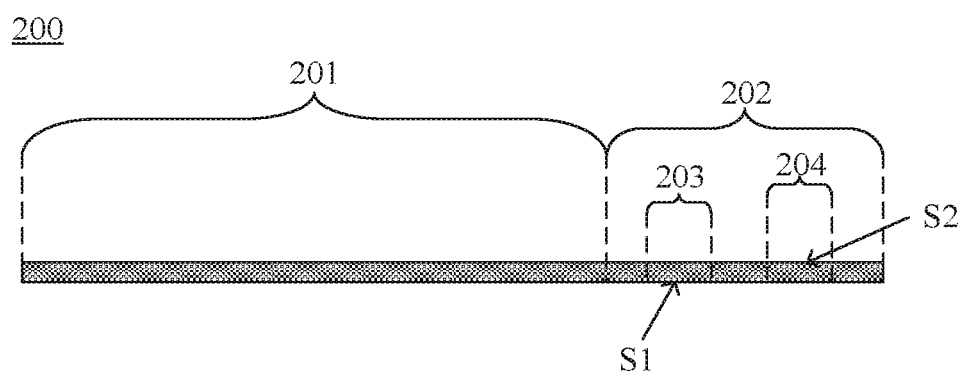
FIG. 2 is a structural diagram of a device to be bent, in accordance with some embodiments.

Based on this, referring to FIGS. 1 and 2, some embodiments of the present disclosure provide a bending apparatus 100. The bending apparatus 100 is used for machining a device to be bent 200.

As shown in FIG. 1, the bending apparatus 100 includes a fixing structure 1, a first driving mechanism 2, a first pressing head 3, a second driving mechanism 4 and a second pressing head 5. As shown in FIG. 2, the device to be bent 200 includes a body portion 201 and a portion to be bent 202 connected to each other, and the portion to be bent 202 includes a first portion 203 and a second portion 204 that are away from the body portion 201 in sequence. A portion between the first portion 203 and the body portion 201 in the device to be bent 200 is made of a flexible material, and a portion between the second portion and the first portion is also made of a flexible material. For example, the device to be bent 200 may be a display module. The body portion 201 of the device to be bent 200 may be a display panel in the display module, and the portion to be bent 202 of the device to be bent 200 may include a flexible printed circuit.

Figure 3A:
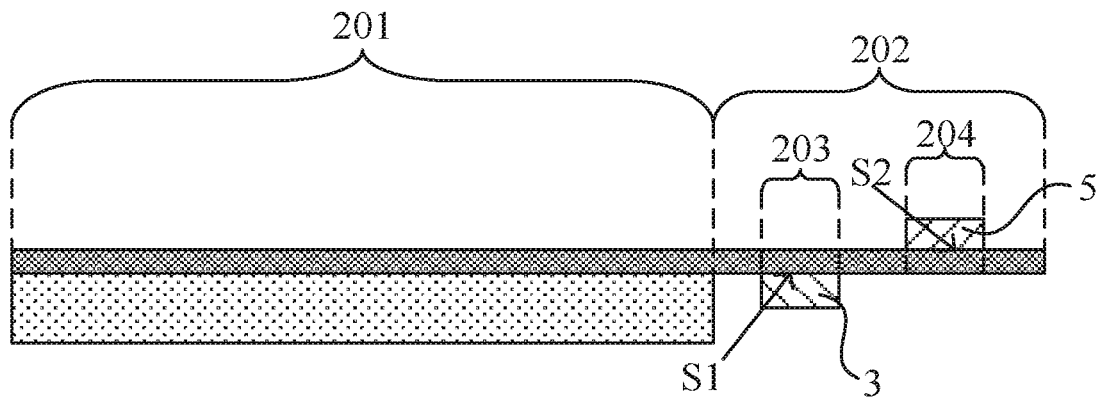
FIG. 3A is a state diagram of a bending apparatus in operation, in accordance with some embodiments.
Figure 3B:
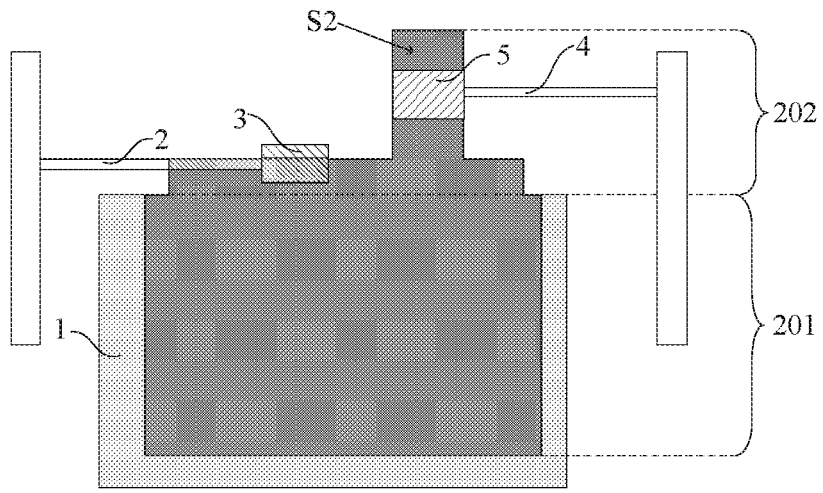
FIG. 3B is another state diagram of a bending apparatus in operation, in accordance with some embodiments.
Figure 4A:
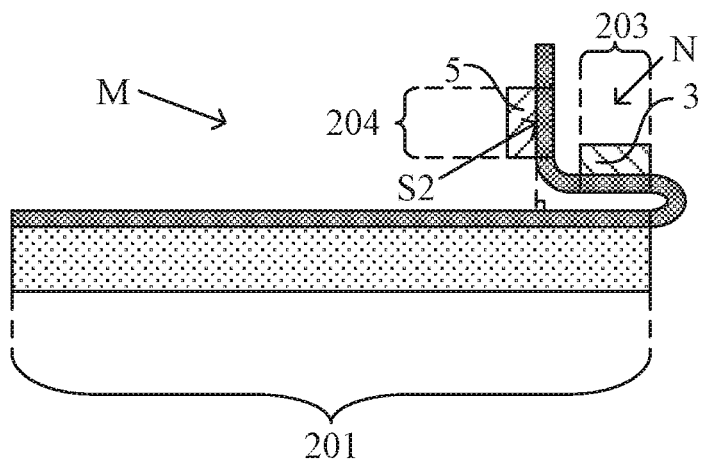
FIG. 4A is yet another state diagram of a bending apparatus in operation, in accordance with some embodiments.
Figure 4B:
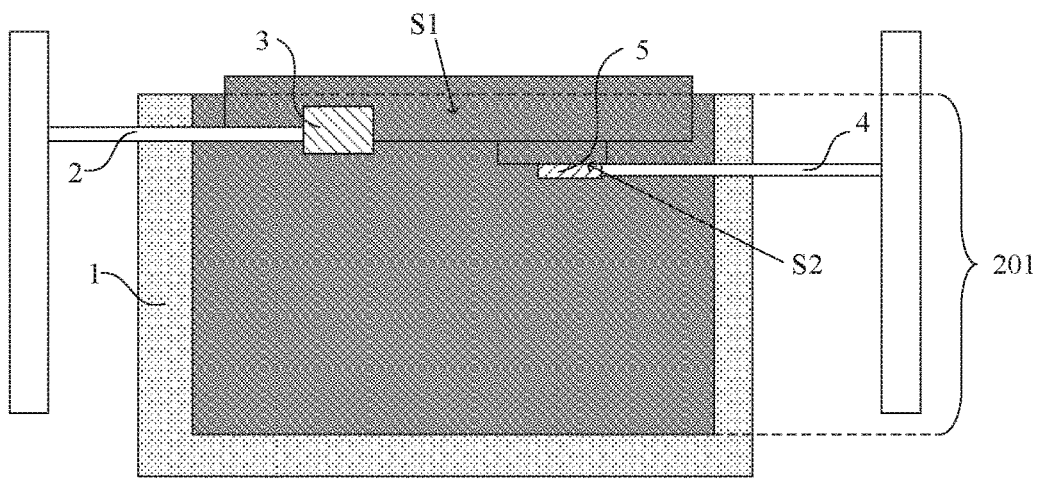
FIG. 4B is yet another state diagram of a bending apparatus in operation, in accordance with some embodiments.

The fixing structure 1 is configured to fix the body portion 201 of the device to be bent 200. The first driving mechanism 2 is connected to the first pressing head 3. The first driving mechanism 2 is configured to drive the first pressing head 3 to move onto a first surface S1 of the first portion 203 (as shown in FIGS. 3A and 3B), and to drive the first pressing head 3 to push the first portion 203 to rotate to a first side M of the body portion 201, so that the first portion 203 is parallel or substantially parallel to the body portion 201 (as shown in FIGS. 4A and 4B). The second driving mechanism 4 is connected to the second pressing head 5. The second driving mechanism 4 is configured to drive the second pressing head 5 to move onto a second surface S2 of the second portion 204 (as shown in FIGS. 3A and 3B). The second surface S2 and the first surface S1 are respectively located on two sides of the portion to be bent 202. The second driving mechanism 4 is further configured to drive the second pressing head 5 to pull the second portion 204 to rotate to the first side M of the body portion 201 (as shown in FIGS. 4A and 4B) while the first pressing head 3 pushes the first portion 203.

For example, "substantially parallel" may mean that the first portion 203 and a plane parallel to the body portion 201 have a small included angle therebetween. For example, the included angle is not more than 10 degrees.

The bending apparatus 100 provided in some embodiments of the present disclosure includes the first driving mechanism 2, the first pressing head 3, the second driving mechanism 4 and the second pressing head 5. The first driving mechanism 2 is capable of driving the first pressing head 3 to push the first portion 203 to rotate to the first side M of the body portion 201, so that the first portion 203 is parallel or substantially parallel to the body portion 201. The second driving mechanism 4 is capable of driving the second pressing head 5 to pull the second portion 204 to rotate to the first side M of the body portion 201 while the first pressing head 3 pushes the first portion 203. Since the second pressing head 5 and the first pressing head 3 operate synchronously, and the second pressing head 5 is in contact with the second surface S2 of the second portion 204, when the first portion 203 is parallel or substantially parallel to the body portion 201, and the second portion 204 is rotated to the first side M of the body portion 201, the second surface S2 of the second portion 204 does not easily contact the body portion 201. Thus, in a subsequent process of bending the device to be bent 200, the bending apparatus 100 is capable of rotating the second portion 204 of the portion to be bent 202 to a side N of the first portion 203 away from the body portion 201. That is, two times of bending of the device to be bent 200 are realized.

In some embodiments, as shown in FIG. 4A, the second pressing head 5 pulls the second portion 204 to rotate to the first side M of the body portion 201 while the first pressing head 3 pushes the first portion 203, so that the second portion 204 is perpendicular or substantially perpendicular to the body portion 201. Here, "substantially perpendicular" may mean that the second portion 204 and a plane perpendicular to the body portion 201 have a small included angle therebetween. For example, the included angle is not more than 10 degrees.

In this way, when the second portion 204 is bent to the side N of the first portion 203 away from the body portion 201, the first portion 203 does not easily move away from the body portion 201 due to an influence of a force in a direction from the body portion 201 to the first portion 203, so that a distance between the first portion 203 and the body portion 201 may be kept small, which is conducive to making the bent device have a small thickness.

Figure 5A:
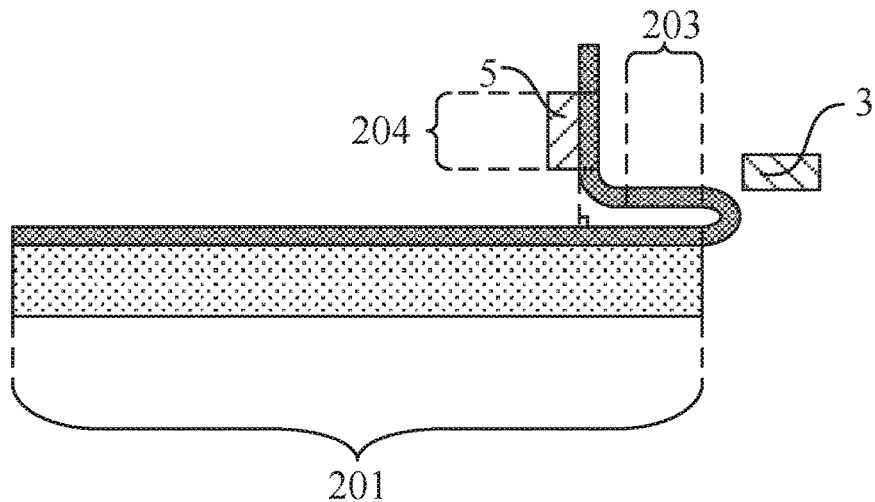
FIG. 5A is yet another state diagram of a bending apparatus in operation, in accordance with some embodiments.
Figure 5B:
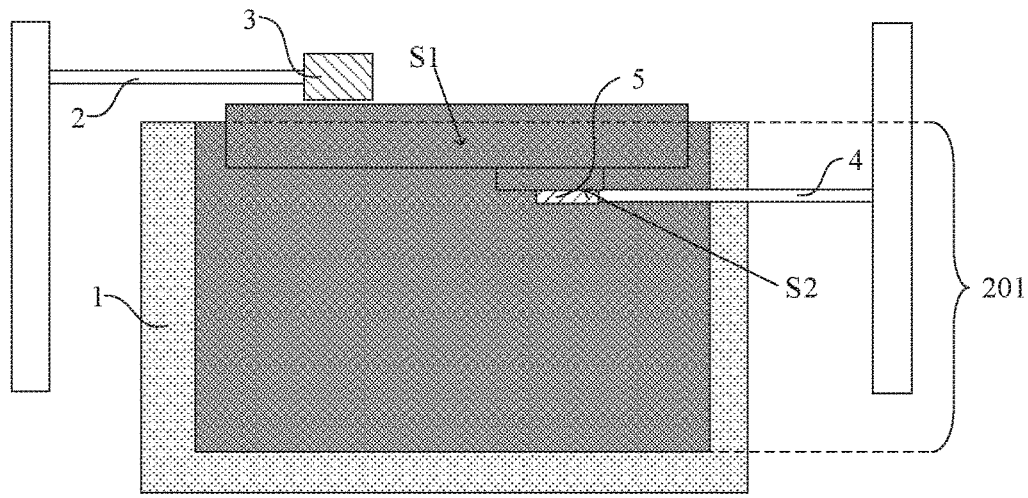
FIG. 5B is yet another state diagram of a bending apparatus in operation, in accordance with some embodiments.

In some embodiments, as shown in FIGS. 5A and 5B, the first driving mechanism 2 is further configured to drive the first pressing head 3 to move away from the first portion 203 after the first portion 203 is parallel or substantially parallel to the body portion 201. In this way, when the second portion 204 is rotated to the side N of the first portion 203 away from the body portion 201, the second portion 204 is prevented from colliding with the first pressing head 3.

Figure 6A:
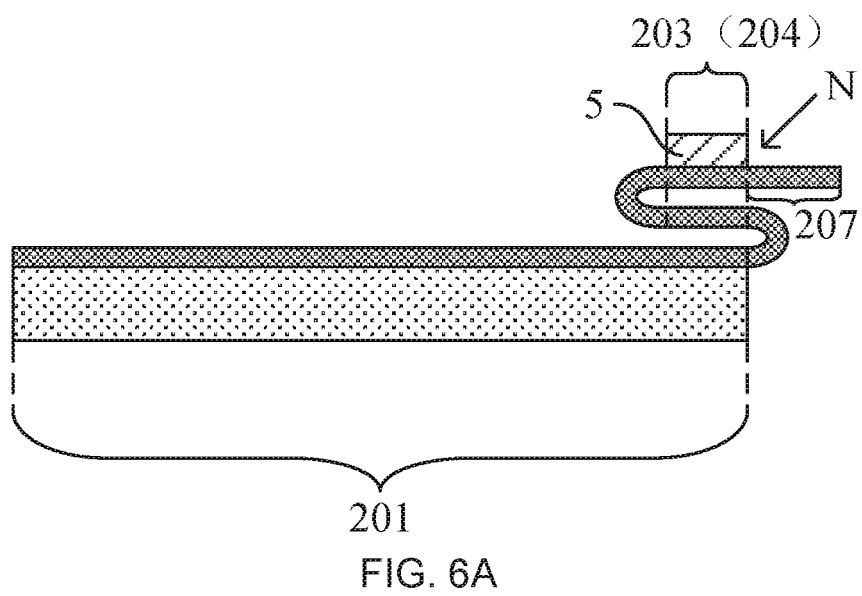
FIG. 6A is yet another state diagram of a bending apparatus in operation, in accordance with some embodiments.
Figure 6B:
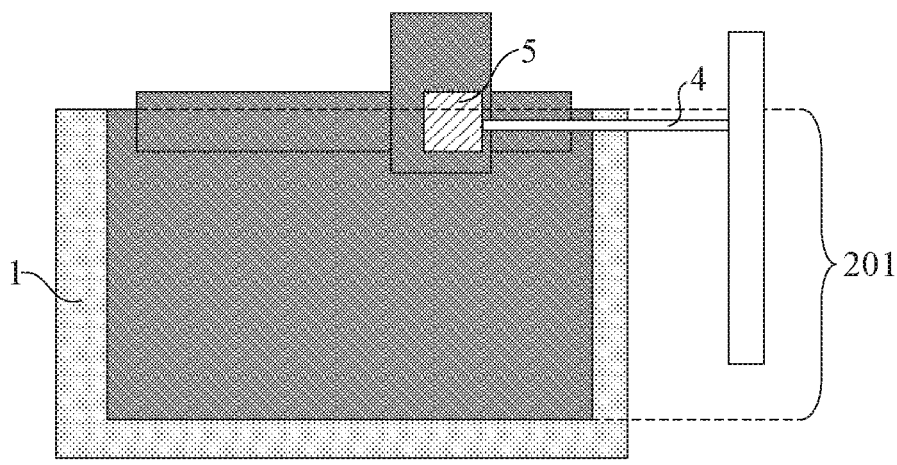
FIG. 6B is yet another state diagram of a bending apparatus in operation, in accordance with some embodiments.

In some embodiments, as shown in FIGS. 6A and 6B, the second driving mechanism 4 is further configured to drive the second pressing head 5 to push the second portion 204 to rotate to the side N of the first portion 203 away from the body portion 201 after the first pressing head 3 moves away from the first portion 203, so that the second portion 204 is parallel or substantially parallel to the first portion 203. Here, "substantially parallel" may mean that the second portion 204 and a plane where the first portion 203 is located have a small included angle therebetween. For example, the included angle is not more than 10 degrees.

By using the second pressing head 5 to push the second portion 204 to rotate to the side N of the first portion 203 away from the body portion 201, an orthographic projection, on a plane where the body portion 201 is located, of a portion 207 of the portion to be bent 202 located on a side of the second portion 204 away from the body portion 201 is located outside the body portion 201.

In a case where the device to be bent 200 is a display module to be bent, the portion of the portion to be bent 202 located on the side of the second portion 204 away from the first portion 203 may be a portion of a flexible printed circuit. In this way, after a second bending process of the device to be bent 200 is completed, the flexible printed circuit may extend to a keyboard region of a display device to be electrically connected to a control circuit board.

Moreover, since the second pressing head 5 pushes the second portion 204 to bend towards the side of the first portion 203 away from the body portion 201 after the first pressing head 3 moves away from the first portion 203, the second portion 204 is able to be prevented from colliding with the first pressing head 3, and the second portion 204 is able to be protected from being damaged.

Figure 7:
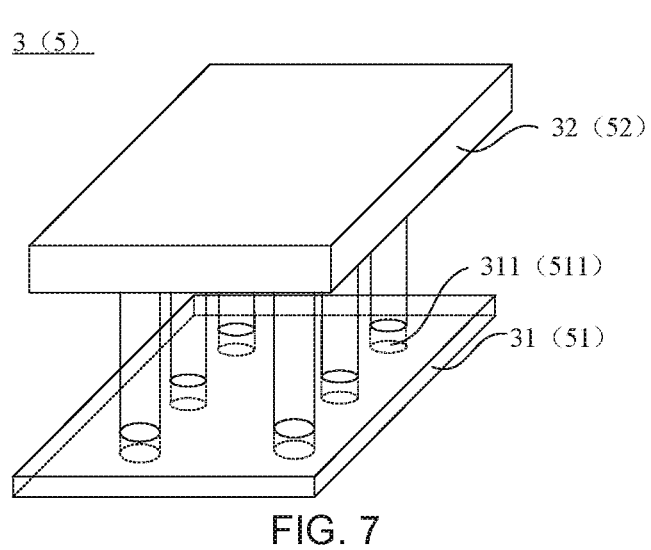
FIG. 7 is a structural diagram of a first pressing head (or second pressing head), in accordance with some embodiments.

In some embodiments, as shown in FIG. 7, the first pressing head 3 may include a first adsorption plate 31 and a first vacuum pumping device 32. At least one first vacuum pumping hole 311 is provided in the first adsorption plate 31. The first vacuum pumping device 32 is communicated with the at least one first vacuum pumping hole 311.

It will be noted that a shape and a size of the first adsorption plate 31 are not limited. For example, as shown in FIG. 7, the first adsorption plate 31 may be a rectangular parallelepiped. A number, a shape, a size and an arrangement of the first vacuum pumping hole(s) 311 are also not limited, as long as the first vacuum pumping hole(s) 311 are capable of effectively adsorbing the first surface S1 of the first portion 203. For example, as shown in FIG. 7, the first vacuum pumping hole 311 may be circular.

The first pressing head 3 provided in some embodiments of the present disclosure includes the first vacuum pumping device 32 and the at least one first vacuum pumping hole 311 disposed in the first adsorption plate 31. Therefore, when the first pressing head 3 is in contact with the first surface S1 of the first portion 203, the first vacuum pumping device 32 is turned on, and a negative pressure environment may be formed in a space formed by the first vacuum pumping hole(s) 311 and the first surface S1 of the first portion 203, so that the first surface S1 of the first portion 203 is adsorbed on the first adsorption plate 31.

In this way, in a process of the first pressing head 3 pushing the first portion 203 to rotate to the first side of the body portion 201, the first vacuum pumping device 32 may be always kept in an on state, so that the first portion 203 and the first pressing head 3 are not easy to be misaligned and separated. Thus, a bending radius of a bending portion between the first portion 203 and the body portion 201 may be small, and a thickness of the bent device is small.

In some embodiments, as shown in FIG. 7, the second pressing head 5 includes a second adsorption plate 51 and a second vacuum pumping device 52. At least one second vacuum pumping hole 511 is provided in the second adsorption plate 51. The second vacuum pumping device 52 is communicated with the at least one second vacuum pumping hole 511.

It will be noted that a shape and a size of the second adsorption plate 51 are not limited. For example, as shown in FIG. 7, the second adsorption plate 51 may be a rectangular parallelepiped. A number, a shape, size and an arrangement of the second vacuum pumping hole(s) 511 are also not limited. For example, referring to FIG. 7, the second vacuum pumping hole 511 may be circular.

The second pressing head 5 provided in some embodiments of the present disclosure includes the second adsorption plate 51 and the second vacuum pumping device 52. Therefore, when the second pressing head 5 is in contact with the second surface S2 of the second portion 204, the second vacuum pumping device 52 is turned on, and a negative pressure environment may be formed in a space formed by the second vacuum pumping hole(s) 511 and the second surface S2 of the second portion 204, so that the second surface S2 of the second portion 204 is adsorbed on the second adsorption plate 51.

Based on this, in a process of the second pressing head 5 pulling the second portion 204 to rotate to the first side of the body portion 201, the second vacuum pumping device 52 may be configured to be always kept in an on state, so that the second surface S2 of the second portion 204 is always adsorbed on the second adsorption plate 51, which is conducive to preventing the second portion 204 from being in direct contact with a surface M1 of the body portion 201 at the first side due to separation of the second portion 204 from the second adsorption plate 51.

Similarly, the second vacuum pumping device 52 may be configured to be always kept in the on state in a process of the second pressing head 5 pushing the second portion 204 to rotate to the side of the first portion 203 away from the body portion 201, so that the second surface S2 of the second portion 204 is always adsorbed on the second adsorption plate 51 of the second pressing head 5. This is conducive to avoiding a large bending radius of a bending portion between the second portion 204 and the first portion 203 and a large thickness of the bent device due to a misalignment between the second portion 204 and the second adsorption plate 51, or to avoiding a case that the second pressing head 5 cannot push the second portion 204 to rotate to the side of the first portion 203 away from the body portion 201 due to a direct separation of the second portion 204 from the second pressing head 5.

The second vacuum pumping device 52 may be further configured to be always kept in the on state in a process of the first pressing head 3 moving away from the first portion 203, so that the second surface S2 of the second portion 204 is always adsorbed on the second adsorption plate 51 of the second pressing head 5. This is conducive to avoiding a case that the second pressing head 5 cannot push the second portion 204 to rotate to the side of the first portion 203 away from the body portion 201 due to a misalignment between the second portion 204 and the second adsorption plate 51 caused by a bounce of the first portion 203 away from the body portion 201.

In some examples, the second vacuum pumping device 52 may be further configured to be always kept in the on state in the process of the second pressing head 5 pulling the second portion 204 to rotate to the first side of the body portion 201 and in the process of the second pressing head 5 pushing the second portion 204 to rotate to the side of the first portion 203 away from the body portion 201.

In some other examples, the second vacuum pumping device 52 may be further configured to be always kept in the on state in the process of the second pressing head 5 pulling the second portion 204 to rotate to the first side of the body portion 201, in the process of the second pressing head 5 pushing the second portion 204 to rotate to the side of the first portion 203 away from the body portion 201, and in the process of the first pressing head 3 moving away from the first portion 203.

Figure 8:
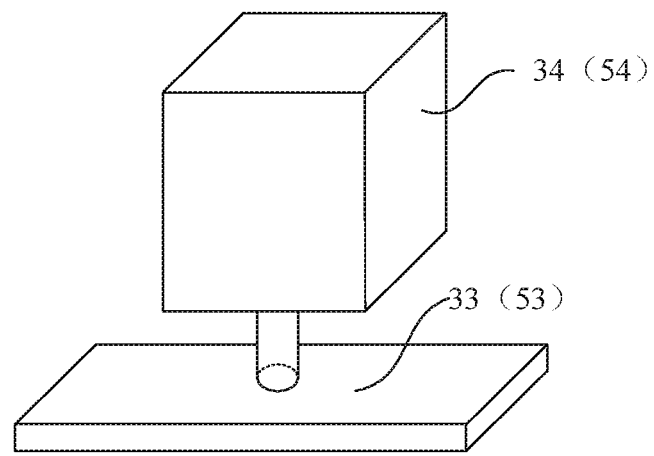
FIG. 8 is a structural diagram of another first pressing head (or second pressing head), in accordance with some embodiments.

In some embodiments, as shown in FIG. 8, the first pressing head 3 further includes a first pressing plate 33 and a first cylinder 34. The first cylinder 34 is connected to the first pressing plate 33, and the first cylinder 34 is configured to drive the first pressing plate 33 to move towards or away from the first portion 203.

Figure 9:
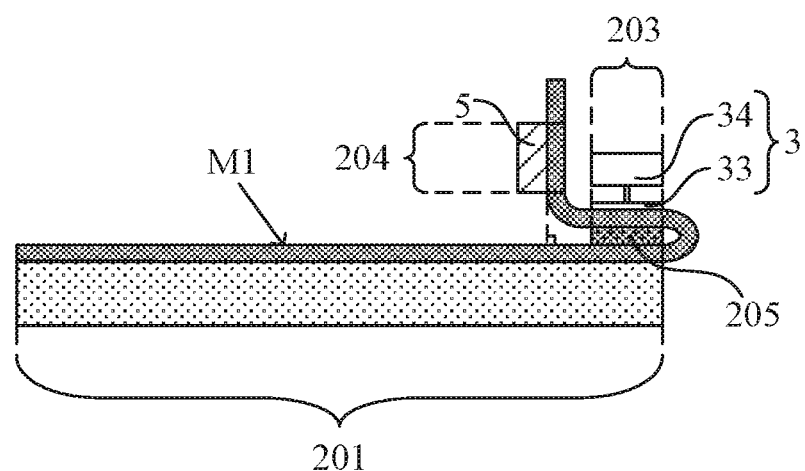
FIG. 9 is yet another state diagram of a bending apparatus in operation, in accordance with some embodiments.

As shown in FIG. 9, the device to be bent 200 further includes a first adhesive layer 205 located on the surface M1 of the body portion 201 at the first side M. When the first pressing head 3 stops pushing the first portion 203, and the first pressing head 3 does not move away from the first portion 203, the first pressing plate 33 is located on a side of the first portion 203 away from the first adhesive layer 205, and an orthographic projection of the first pressing plate 33 on the body portion 201 is at least partially overlapped with an orthographic projection of the first adhesive layer 205 on the body portion 201. The first cylinder 34 is configured to drive the first pressing plate 33 to move towards the first portion 203, so that the first portion 203 and the body portion 201 are adhered together through the first adhesive layer 205.

In this way, after the first pressing head 3 moves away from the first portion 203, the first portion 203 is less likely to bounce away from the body portion 201, and the distance between the first portion 203 and the body portion 201 may be small, so that the thickness of the bent device is effectively reduced.

In some embodiments, as shown in FIG. 8, the second pressing head 5 includes a second pressing plate 53 and a second cylinder 54. The second cylinder 54 is connected to the second pressing plate 53, and the second cylinder 54 is configured to drive the second pressing plate 53 to move towards or away from the second portion 204.

Figure 10:
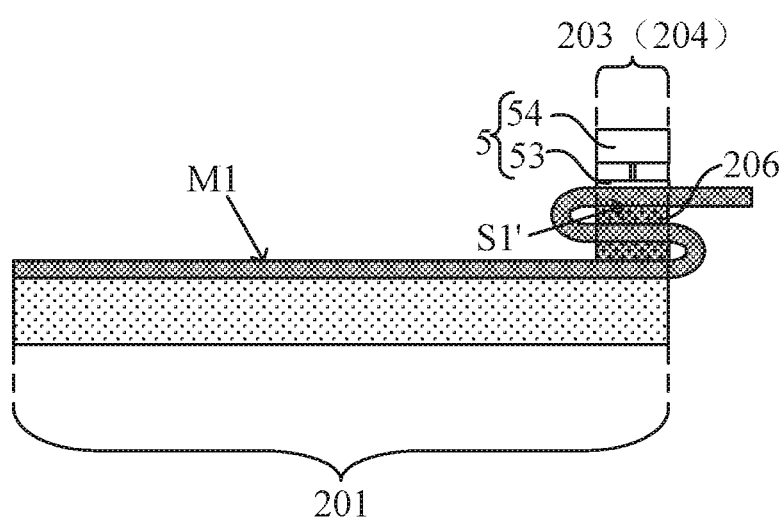
FIG. 10 is yet another state diagram of a bending apparatus in operation, in accordance with some embodiments.

As shown in FIG. 10, the device to be bent 200 further includes a second adhesive layer 206 located on a first surface S1' of the second portion 204. When the second pressing head 5 stops pushing the second portion 204, and the second pressing head 5 does not move away from the second portion 204, the second pressing plate 53 is located on a side of the second portion 204 away from the second adhesive layer 206, and an orthographic projection of the second pressing plate 53 on the body portion 201 is at least partially overlapped with an orthographic projection of the second adhesive layer 206 on the body portion 201. The second cylinder 54 is configured to drive the second pressing plate 53 to move towards the second portion 204, so that the second portion 204 and the first portion 203 are adhered together through the second adhesive layer 206.

In this way, after the second pressing head 5 moves away from the second portion 204, the second portion 204 is less likely to bounce away from the first portion, and a gap between the second portion 204 and the first portion 203 may be small, which is conducive to reducing the thickness of the bent device.

Figure 11:
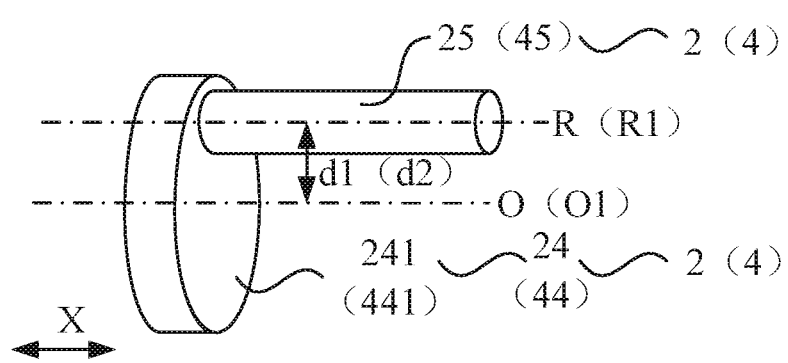
FIG. 11 is a structural diagram of a first rotation structure and a first rotation arm (or a second rotation structure and a second rotation arm), in accordance with some embodiments.

In some embodiments, as shown in FIGS. 1 and 11, the first driving mechanism 2 includes a first base 21, a first Y-axis movement mechanism 22, a first Z-axis movement mechanism 23, a first X-axis rotation mechanism 24 and a first rotation arm 25. The first Y-axis movement mechanism 22 is disposed on the first base 21. The first Y-axis movement mechanism 22 includes a first support structure 221 capable of moving in a Y-axis direction relative to the first base 21. The first Z-axis movement mechanism 23 is disposed on the first support structure 221. The first Z-axis movement mechanism 23 includes a second support structure 231 capable of moving in a Z-axis direction relative to the first support structure 221. The first X-axis rotation mechanism 24 is disposed on the second support structure 231. The first X-axis rotation mechanism 24 includes a first rotation structure 241 capable of rotating about a rotation axis O parallel to an X-axis direction relative to the second support structure 231. An end of the first rotation arm 25 is connected to the first rotation structure 241, and another end of the first rotation arm 25 is connected to the first pressing head 3. The first rotation arm 25 is parallel to the rotation axis O of the first rotation structure 241, and an axis R of the first rotation arm 25 and the rotation axis O of the first rotation structure 241 have a first preset distance d1 therebetween.

The first preset distance d1 may be adjusted according to a size of the device to be bent. For example, in a case where the size of the device to be bent is large, a value of the first preset distance d1 may be large. In a case where the size of the device to be bent is small, the value of the first preset distance d1 may be small.

For example, the first Y-axis movement mechanism 22 may further include a first driving motor and a first lead screw slider mechanism. The first driving motor is installed on the first base 21. The first lead screw slider mechanism includes a first lead screw and a first slider in threaded connection with the first lead screw. The first lead screw is connected to an output shaft of the first driving motor. The first slider is installed on a guide rail of the first base 21, and is connected to the first support structure 221. The first driving motor drives the first lead screw to rotate, so that the first slider may move in the Y-axis direction relative to the first lead screw, thereby enabling the first support structure 221 to move in the Y-axis direction relative to the first base 21.

For example, the first Z-axis movement mechanism 23 may further include a second driving motor and a second lead screw slider mechanism. The second driving motor is installed on the first support structure 221. The second lead screw slider mechanism includes a second lead screw and a second slider in threaded connection with the second lead screw. The second lead screw is connected to an output shaft of the second driving motor. The second slider is installed on a guide rail of the first support structure 221, and is connected to the second support structure 231. The second driving motor drives the second lead screw to rotate, so that the second slider may move in the Z-axis direction relative to the second lead screw, thereby enabling the second support structure 231 to move in the Z-axis direction relative to the first support structure 221.

For example, referring to FIG. 1, the first X-axis rotation mechanism 24 may further include a driving motor 242 connected to the first rotation structure 241. The driving motor 242 is configured to drive the first rotation structure 241 to move clockwise or counterclockwise about the rotation axis.

In this way, the first Y-axis movement mechanism 22, the first Z-axis movement mechanism 23, the first X-axis rotation mechanism 24 and the first rotation arm 25 cooperate with each other to drive the first pressing head 3 to rotate the first portion 203 to the first side of the body portion 201.

It will be noted that in a process of the first driving mechanism 2 driving the first pressing head 3 to push the first portion 203 to rotate to the first side of the body portion 201, the first Y-axis movement mechanism 22, the first Z-axis movement mechanism 23 and the first X-axis rotation mechanism 24 operate synchronously. For example, the process of the first driving mechanism 2 driving the first pressing head 3 to push the first portion 203 to rotate to the first side of the body portion 201 may include as follows. The first support structure 221 of the first Y-axis movement mechanism 22 moves in the Y-axis direction, so that the first pressing head 3 gradually approaches the first portion 203.

The second support structure 231 of the first Z-axis movement mechanism 23 moves upward and then downward in the Z-axis direction. The first rotation structure 241 of the first X-axis rotation mechanism 24 rotates about the rotation axis O by about 180 degrees to bring the first rotation arm 25 to rotate about the rotation axis O by about 180 degrees, thereby enabling the first pressing head 3 to rotate to the first side of the body portion 201.

In addition, after the first pressing head 3 stops pushing the first portion 203, and the first portion 203 is parallel or substantially parallel to the body portion 201, the first Y-axis movement mechanism 22 is further capable of gradually moving the first pressing head 3 away from the first portion 203 in the Y-axis direction.

In some embodiments, as shown in FIGS. 1 and 11, the second driving mechanism 4 may include a second base 41, a second Y-axis movement mechanism 42, a second Z-axis movement mechanism 43, a second X-axis rotation mechanism 44 and a second rotation arm 45. The second Y-axis movement mechanism 42 is disposed on the second base 41. The second Y-axis movement mechanism 42 includes a third support structure 421 capable of moving in the Y-axis direction relative to the second base 41. The second Z-axis movement mechanism 43 is disposed on the third support mechanism 421. The second Z-axis movement mechanism 43 includes a fourth support structure 431 capable of moving in the Z-axis direction relative to the third support structure 421. The second X-axis rotation mechanism 44 is disposed on the fourth support structure 431. The second X-axis rotation mechanism 44 includes a second rotation structure 441 capable of rotating about a rotation axis O1 parallel to the X-axis direction relative to the fourth support structure 431. An end of the second rotation arm 45 is connected to the second rotation structure 441, and another end of the second rotation arm 45 is connected to the second pressing head 5. The second rotation arm 45 is parallel to the rotation axis O1 of the second rotation structure 441, and an axis R1 of the second rotation arm 45 and the rotation axis O1 of the second rotation structure 441 have a second preset distance d2 therebetween.

The second preset distance d2 may be accordingly set according to the size of the device to be bent. For example, in the case where the size of the device to be bent is large, a value of the second preset distance d2 may be large. In the case where the size of the device to be bent is small, the value of the second preset distance d2 may be small.

For example, the second Y-axis movement mechanism 42 may further include a third driving motor and a third lead screw slider mechanism. The third driving motor is installed on the second base. The third lead screw slider mechanism includes a third lead screw and a third slider in threaded connection with the third lead screw. The third lead screw is connected to an output shaft of the third driving motor. The third slider is installed on a guide rail of the second base 41, and is connected to the third support structure. The third driving motor drives the third lead screw to rotate, so that the third slider may move in the Y-axis direction relative to the third lead screw, thereby enabling the third support structure 421 to move in the Y-axis direction relative to the second base 41.

For example, the second Z-axis movement mechanism 43 may further include a fourth driving motor and a fourth lead screw slider mechanism. The fourth driving motor is installed on the third support structure 421. The fourth lead screw slider mechanism includes a fourth lead screw and a fourth slider in threaded connection with the fourth lead screw. The fourth screw is connected to an output shaft of the fourth driving motor. The fourth slider is installed on a guide rail of the third support structure 421, and is connected to the fourth support structure 431. The fourth driving motor drives the fourth lead screw to rotate, so that the fourth slider may move in the Z-axis direction relative to the fourth lead screw, thereby enabling the fourth support structure 431 to move in the Z-axis direction relative to the third support structure.

For example, the second X-axis rotation mechanism 44 may further include a driving motor connected to the second rotation structure 441. The driving motor drives the second rotation structure 441 to move clockwise or counterclockwise about the rotation axis.

In this way, the second pressing head 5 may be driven to operate by using the second Y-axis movement mechanism 42, the second Z-axis movement mechanism 43, the second X-axis rotation mechanism 44 and the second rotation arm 45, so that the second pressing head 5 is capable of pulling the second portion 204 to rotate to the first side of the body portion 201, and pushing the second portion 204 to rotate to the side of the first portion 203 away from the body portion 201.

It will be noted that in a process of the second driving mechanism 4 driving the second pressing head 5 to pull the second portion 204 to rotate to the first side of the body portion 201, the second Y-axis movement mechanism 42, the second Z-axis movement mechanism 43 and the second X-axis rotation mechanism 44 operate synchronously. For example, in the process of the second pressing head 5 pulling the second portion 204 to rotate to the first side of the body portion 201, the third support structure 421 of the second Y-axis movement mechanism 42 moves in the Y-axis direction relative to the second base 41, so that the second pressing head 5 gradually approaches the second portion 204 in the Y-axis direction. The fourth support structure 431 of the second Z-axis movement mechanism 43 moves upward relative to the third support structure 421. The second rotation structure 441 of the second X-axis rotation mechanism 44 rotates about the rotation axis O1 by 90 degrees, so that the second pressing head 5 is rotated to the first side of the body portion 201.

Similarly, in a process of the second driving mechanism 4 driving the second pressing head 5 to push the second portion 204 to rotate to the side of the first portion 203 away from the body portion 201, the second Y-axis movement mechanism 42, the second Z-axis movement mechanism 43 and the second X-axis rotation mechanism 44 operate synchronously. For example, in the process of the second pressing head 5 pushing the second portion 204 to rotate to the side of the first portion 203 away from the body portion 201, the third support structure 421 of the second Y-axis movement mechanism 42 moves in the Y-axis direction relative to the second base 41, so that the second pressing head 5 moves towards the first portion 203. The fourth support structure 431 of the second Z-axis movement mechanism 43 moves upward and then downward relative to the third support structure 421. The second rotation structure 441 of the second X-axis rotation mechanism 44 rotates about the rotation axis O1 by 90 degrees, so that the second pressing head 5 is rotated to the side of the first portion 203 away from the body portion 201.

In some embodiments, as shown in FIG. 1, the first rotation structure 241 and the second rotation structure 441 are respectively located on two opposite sides of the fixing structure 1 in the X-axis direction. The first rotation arm 25 extends to a side of the second rotation structure 441 proximate to the fixing structure 1, and the second rotation arm 45 extends to a side of the first rotation structure 241 proximate to the fixing structure 1.

In this way, on one hand, lengths of the first rotation arm 25 and the second rotation arm 45 are short, so that a height difference, in the Z-axis direction, between an end of the first rotation arm 25 connected to the first rotation structure 241 and an end of the first rotation arm 25 connected to the first pressing head 3 is small, and a height difference, in the Z-axis direction, between an end of the second rotation arm 45 connected to the second rotation structure 441 and an end of the second rotation arm 45 connected to the second pressing head 5 is also small, which is conducive to improving a control accuracy of heights of the first pressing head 3 and the second pressing head 5 in the Z-axis direction in the moving process.

On another hand, the first rotation structure 241 and the second rotation structure 441 are respectively arranged on two sides of the fixing structure 1, so that in a first bending process, the first pressing head 3 and the second pressing head 5 move synchronously (i.e., the first pressing head 3 pushes the first portion 203 to rotate to the first side of the body portion 201, and at the same time, the second pressing head 5 pulls the second portion 204 to rotate to the first side of the body portion 201). Moreover, the first pressing head 3 and the second pressing head 5 are not easy to collide, or the first rotation arm 25 and the second rotation arm 45 are not easy to collide, so that a failure of the bending apparatus 100 during operation is avoided.

In some embodiments, as shown in FIG. 1, the X axis, the Y axis and the Z axis are perpendicular to each other, and the X axis and the Y axis are parallel to a horizontal plane.

Figure 12:
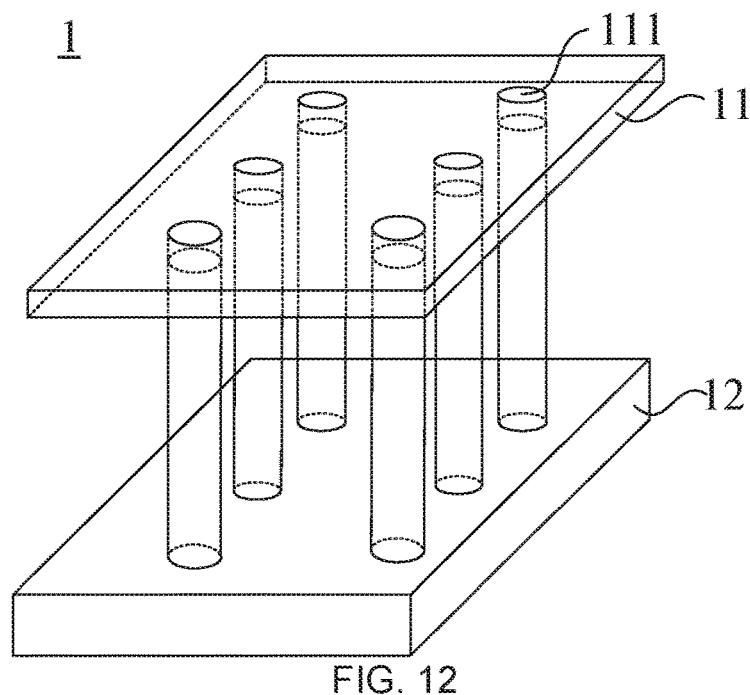
FIG. 12 is a structural diagram of a fixing structure, in accordance with some embodiments.

In some embodiments, as shown in FIG. 12, the fixing structure 1 includes a carrier plate 11 and a third vacuum pumping device 12. A plurality of vacuum pumping holes 111 are provided in the carrier plate 11. The third vacuum pumping device 12 is communicated with the plurality of vacuum pumping holes 111.

A shape and a size of the carrier plate 11 are not limited, as long as the carrier plate 11 is ensured to support the body portion 201 of the device to be bent 200. For example, referring to FIG. 12, an orthographic projection of the carrier plate 11 on the horizontal plane may be a rectangle.

A number, a size, a shape and an arrangement of the vacuum pumping holes 111 disposed in the carrier plate 11 are not limited, as long as the vacuum pumping holes 111 are able to be in contact with the body portion 201 of the device to be bent 200, and are able to adsorb the body portion 201 of the device to be bent 200 due to an action of the third vacuum pumping device 12. For example, as shown in FIG. 12, an orthogonal projection of the vacuum pumping hole 111 on the horizontal plane may be a circle.

In this way, the plurality of vacuum pumping holes 111 are disposed in the carrier plate 11, and the third vacuum pumping device 12 is communicated with the plurality of vacuum pumping holes 111, so that when the bending apparatus 100 bends the device to be bent 200, the third vacuum pumping device 12 is turned on, and the body portion 201 of the device to be bent 200 may be adsorbed on the carrier plate 11. Therefore, the device to be bent is prevented from being damaged due to a friction between the device to be bent 200 and the carrier plate caused by a relative movement between the body portion 201 and the carrier plate 11 in the bending process. Moreover, the body portion 201 is fixed to the carrier plate 11 in the bending process, which is further conducive to bending the device to be bent 200 by the bending apparatus 100.

For example, the fixing structure 1 may further include an isolation film disposed on the carrier plate, and isolation film covers the carrier plate 11 completely. In this way, in the case where the size of the device to be bent 200 is small, a portion of the isolation film with a small area may be removed to expose a small part of the vacuum pumping holes 111, so that the fixing structure 1 is capable of adsorbing the device to be bent 200 with a small size. In the case where the size of the device to be bent 200 is large, a portion of the isolation film with a large area may be removed to expose more vacuum pumping holes 111, so as to adsorb the device to be bent 200 with a large size. In this way, the fixing structure 1 is capable of fixing various devices to be bent 200 with different sizes, which improves a flexibility of use of the bending apparatus 100.

In some embodiments, as shown in FIG. 1, the bending apparatus 100 further includes a third driving mechanism 6. The third driving mechanism 6 includes a third base 61 and a third Y-axis movement mechanism 62. The third Y-axis movement mechanism 62 is disposed on the third base 61. The third Y-axis movement mechanism 62 includes a fifth support structure 621 capable of moving in the Y-axis direction relative to the third base 61. The carrier plate 11 is disposed on the fifth support structure 621. This arrangement enables the carrier plate 11 to move in the Y-axis direction together with the fifth support mechanism 621 relative to the third base 61.

On this basis, before the device to be bent 200 is machined by using the bending apparatus 100, the carrier plate 11 may be aligned with the device to be bent 200 firstly, so that the body portion 201 of the device to be bent 200 covers a designated position of the carrier plate 11, thereby facilitating the first driving mechanism 2 to drive the first pressing head 3 to move to the first surface S1 of the first portion 203, and facilitating the second driving mechanism 4 to drive the second pressing head 5 to move to the second surface S2 of the second portion 204.

For example, a process of aligning the carrier plate 11 with the device to be bent 200 may be as follows. Before the bending apparatus 100 bends the device to be bent 200, the carrier plate 11 is transferred to a first position by using the third driving mechanism 6. The device to be bent 200 is placed on the carrier plate 11, and the device to be bent 200 is preliminarily aligned, so that an orthographic projection of the device to be bent 200 on the carrier plate 11 is substantially overlapped with the designated position. Then, the carrier plate 11 is transferred to a second position by using the third driving mechanism 6. The body portion 201 of the device to be bent 200 is precisely aligned with the carrier plate 11 by using a charge coupled device (CCD) camera. In the X-axis direction, a distance from the first position to the first driving mechanism 2 is greater than a distance from the second position to the first driving mechanism 2, and a distance from the first position to the second driving mechanism 4 is also greater than a distance from the second position to the second driving mechanism 4.

Figure 13:
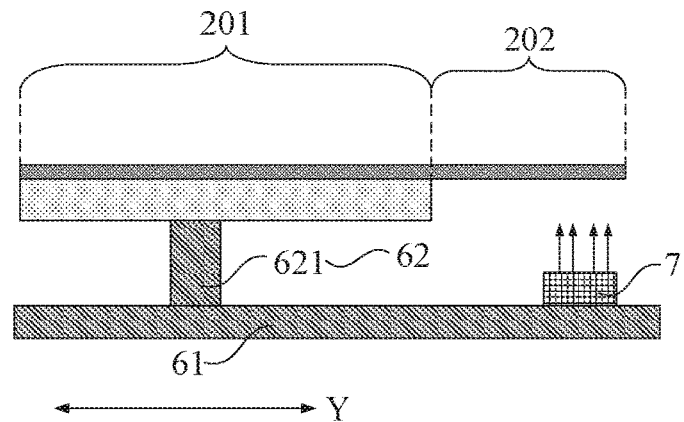
FIG. 13 is yet another state diagram of a bending apparatus in operation, in accordance with some embodiments.

In some embodiments, as shown in FIG. 13, the bending apparatus 100 further includes at least one blower 7 disposed on the third base 61. The at least one blower 7 is configured to, before the first pressing head 3 moves to the first surface of the first portion 203, and before the second pressing head 5 moves to the second surface of the second portion 204, blow air to the portion to be bent 202, so that the portion to be bent 202 and the body portion 201 are located in the same plane or substantially in the same plane.

In this way, the first pressing head 3 is capable of being in well contact with the first surface S1 of the first portion 203, and the second pressing head 5 is capable of being in well contact with the second surface S2 of the second portion 204. Thus, when the first pressing head 3 is in contact with the first surface S1 of the first portion 203, the first pressing head 3 is prevented from scratching the first surface S1, so as to prevent devices or circuit structures disposed on the first surface S1 from being damaged. Moreover, a contact area between the second pressing head 5 and the second surface S2 of the second portion 204 is large, so that the second portion 204 is prevented from being in direct contact with the body portion 201 due to the separation of the second portion 204 from the second pressing head 5 in the bending process, which is caused by a fact that the second pressing head 5 cannot well adsorb the second surface S2 of the second portion 204 due to a too small contact area.

A number of the blower(s) 7 is not limited in the embodiments of the present disclosure, as long as the portion to be bent 202 and the body portion 201 are able to be located in the same plane or substantially in the same plane. Here, "substantially in the same plane" may mean that a plane where the portion to be bent 202 is located and the plane where the body portion 201 is located have a small included angle therebetween, and the included angle is not more than 10 degrees.

Figure 14:
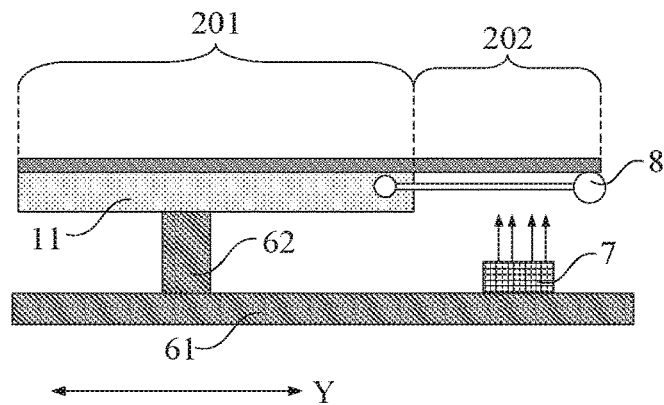
FIG. 14 is yet another state diagram of a bending apparatus in operation, in accordance with some embodiments.

In some other embodiments, as shown in FIG. 14, the bending apparatus 100 may further include at least one support rod 8 connected to the carrier plate 11. The at least one support rod 8 is configured to, before the first pressing head 3 moves to the first surface S1 of the first portion 203, and before the second pressing head 5 moves to the second surface S2 of the second portion 204, support the portion to be bent 202, so that the portion to be bent 202 and the body portion 201 are located in the same plane or substantially in the same plane.

In this way, the first pressing head 3 is capable of being in well contact with the first surface of the first portion 203, and the second pressing head 5 is capable of being in well contact with the second surface of the second portion 204. Thus, when the first pressing head 3 is in contact with the first surface S1 of the first portion 203, the first pressing head 3 is prevented from scratching the first surface S1, so as to prevent devices or circuit structures disposed on the first surface from being damaged. Moreover, this is conducive to preventing the second portion 204 from being in direct contact with the body portion 201 due to the separation of the second portion 204 from the second pressing head 5 in the bending process, which is caused by the fact that the second pressing head 5 cannot well adsorb the second surface S2 of the second portion 204 due to a too small contact area between the second pressing head 5 and the second surface S2 of the second portion 204.

A number of the support rod(s) 8 is not limited in the embodiments of the present disclosure, as long as the portion to be bent 202 and the body portion 201 are able to be located in the same plane or substantially in the same plane.

Here, "substantially in the same plane" may mean that the plane where the portion to be bent 202 is located and the plane where the body portion 201 is located have a small included angle therebetween, and the included angle is not more than 10 degrees.

In yet other embodiments, the bending apparatus 100 may include the at least one blower 7 and the at least one support rod 8. This arrangement better enables the portion to be bent 202 and the body portion 201 to be located in the same plane or substantially in the same plane, thereby facilitating the first pressing head 3 to be in contact with the first surface S1 of the first portion 203, and facilitating the second pressing head 5 to be in contact with the second surface S2 of second portion 204.

Figure 15:
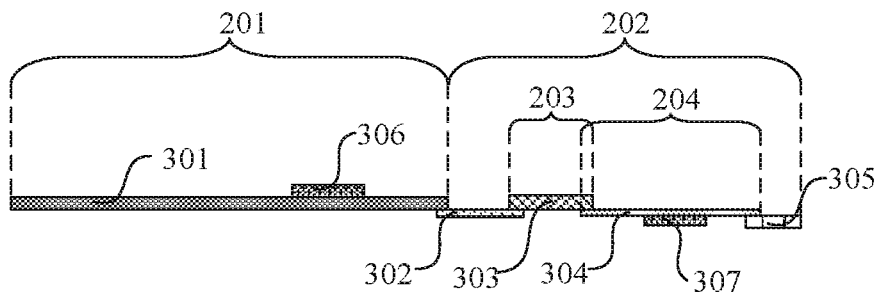
FIG. 15 is a structural diagram of another device to be bent, in accordance with some embodiments.

Some embodiments of the present disclosure further provide the device to be bent 200, as shown in FIG. 15, the device to be bent is a display module to be bent 300. The display module to be bent 300 includes a display panel 301, a COF (Chip On Film) circuit board 302, a printed circuit board 303, a flexible printed circuit 304 and a clock control circuit board 305. An end of the COF circuit board 302 is bonded to the display panel 301. An end of the printed circuit board 303 is bonded to another end of the COF circuit board 302. An end of the flexible printed circuit 304 is bonded to another end of the printed circuit board 303. An end of the clock control circuit board 305 is bonded to another end of the flexible printed circuit 304.

It will be noted that the display panel 301 is the body portion 201 of the device to be bent 200, the printed circuit board 303 is the first portion 203 of the device to be bent 200, and the flexible printed circuit 304 is the second portion 204 of the device to be bent 200.

For example, the display panel 301 may be a liquid crystal display panel (LCD), an organic light-emitting diode (OLED) display panel, or a quantum dot light-emitting diode (QLED) display panel.

The device to be bent 200 provided in some embodiments of the present disclosure is the display module to be bent 300. The end of the clock control circuit board 305 in the display module 300 is bonded to the end of the flexible printed circuit 304 away from the printed circuit board 303. Compared with the related art in which a clock control circuit board is disposed on a printed circuit board, the device to be bent 200 provided in some embodiments of the present disclosure is bent twice to have a small thickness.

In some embodiments, as shown in FIG. 15, the display module to be bent 300 may further include a first filling layer 306 disposed on a first side of the display panel 301 and a second filling layer 307 disposed on a second surface of the flexible printed circuit 304. The first filling layer 306 is the first adhesive layer 205 of the device to be bent 200, and the second filling layer 307 is the second adhesive layer 206 of the device to be bent.

The first filling layer 306 is used for adhering the printed circuit board 303 (i.e., the first portion 203) to the display panel (i.e., the body portion 201) in a bending process of the display module to be bent. The second filling layer 307 is used for adhering the printed circuit board 303 (i.e., the first portion 203) to the flexible printed circuit 304 (i.e., the second portion 204) in the bending process.

By providing the first filling layer 306 and the second filling layer 307, the printed circuit board 303 is capable of being fixed to the display panel 301, and the flexible printed circuit 304 is capable of being fixed to the printed circuit board 303, so that after bending, the printed circuit board 303 and the flexible printed circuit 304 are prevented from bouncing away from the display panel. On another hand, by providing the first filling layer 306 and the second filling layer 307, in the bent display module, a distance between the printed circuit board 303 and the display panel 301 is small, and a distance between the flexible printed circuit 304 and the printed circuit board 303 is small, which is conducive to reducing a thickness of the bent display module.

Figure 16:
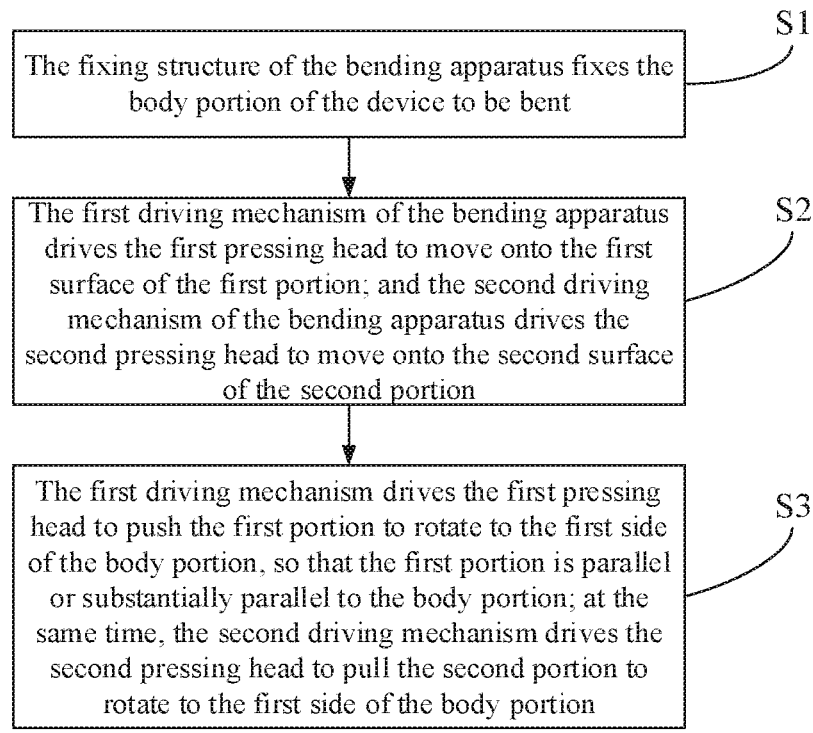
FIG. 16 is a flow diagram of a machining method, in accordance with some embodiments.

Some embodiments of the present disclosure provide a method of machining the device to be bent 200 by using the bending apparatus 100. As shown in FIG. 16, the method includes following steps.

In S1, the fixing structure 1 of the bending apparatus 100 fixes the body portion 201 of the device to be bent 200.

In S2, the first driving mechanism 2 of the bending apparatus 100 drives the first pressing head 3 to move to the first surface S1 of the first portion 203, and the second driving mechanism 4 of the bending apparatus 100 drives the second pressing head 5 to move to the second surface S2 of the second portion 204. The second surface S2 and the first surface S1 are respectively located on two sides of the portion to be bent 202.

In S3, the first driving mechanism 2 drives the first pressing head 3 to push the first portion 203 to rotate to the first side of the body portion 201, so that the first portion 203 is parallel or substantially parallel to the body portion 201. At the same time, the second driving mechanism 4 drives the second pressing head 5 to pull the second portion 204 to rotate to the first side of the body portion 201.

In the machining method provided in some embodiments of the present disclosure, the first driving mechanism 2 drives the first pressing head 3 to push the first portion 203 to rotate to the first side of the body portion 201, so that the first portion 203 is parallel or substantially parallel to the body portion 201. The second driving mechanism 4 drives the second pressing head 5 to pull the second portion 204 to rotate to the first side of the body portion 201 while the first pressing head 3 pushes the first portion 203. Since the second pressing head 5 and the first pressing head 3 operate synchronously, and the second pressing head 5 is in contact with the second surface S2 of the second portion 204, when the first portion 203 is parallel or substantially parallel to the body portion 201, and the second portion 204 is rotated to the first side of the body portion 201, a portion of the portion to be bent 202 located on a side of the first portion 203 away from the body portion 201 is not easy to contact the body portion 201. Thus, the bending apparatus 100 is capable of rotating the second portion 204 of the portion to be bent 202 to the side of the first portion 203 away from the body portion 201 in a subsequent process of bending the device to be bent 200. That is, two times of bending of the device to be bent 200 are realized.

Figure 17:
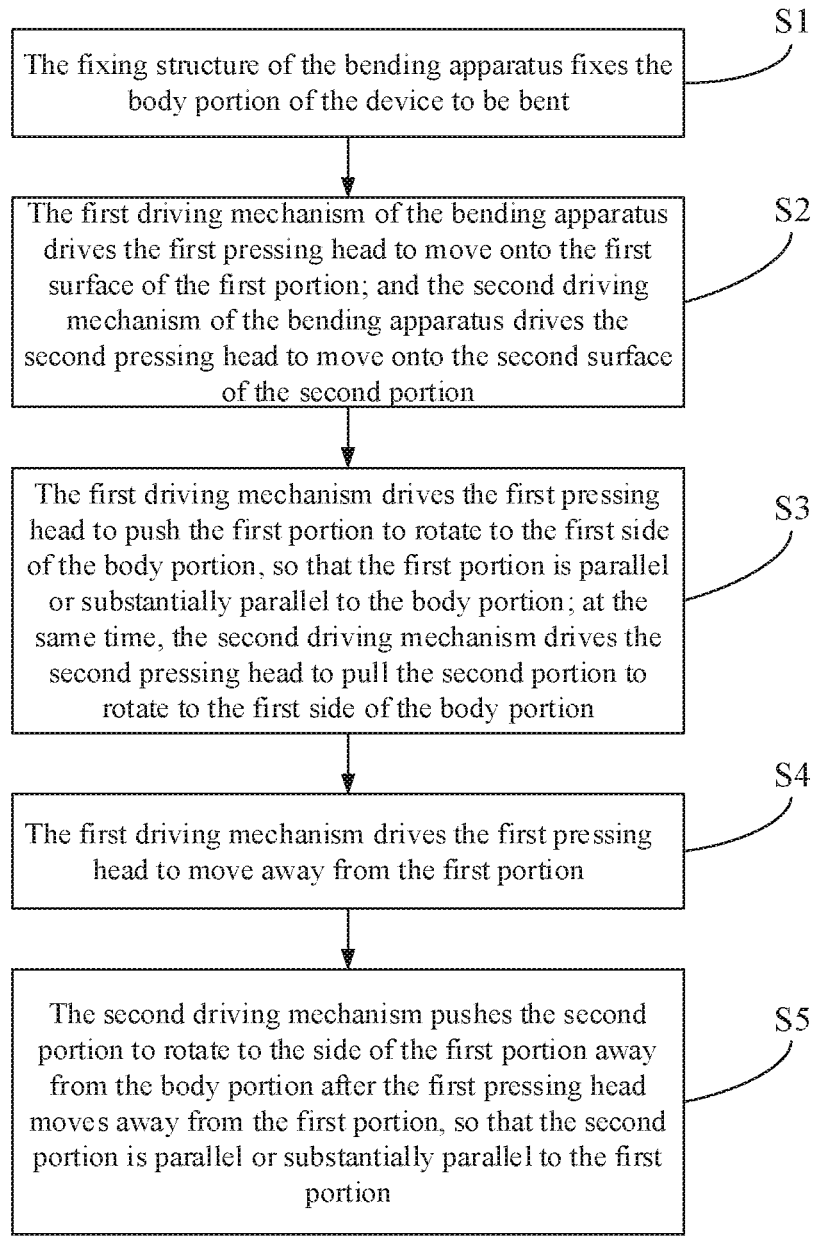
FIG. 17 is a flow diagram of another machining method, in accordance with some embodiments.

In some embodiments, as shown in FIG. 17, the machining method further includes following steps.

In S4, the first driving mechanism 2 drives the first pressing head 3 to move away from the first portion 203.

In S5, after the first pressing head 3 moves away from the first portion 203, the second driving mechanism 4 pushes the second portion 204 to rotate to the side of the first portion 203 away from the body portion 201, so that the second portion 204 is parallel or substantially parallel to the first portion 203.

Figure 18:
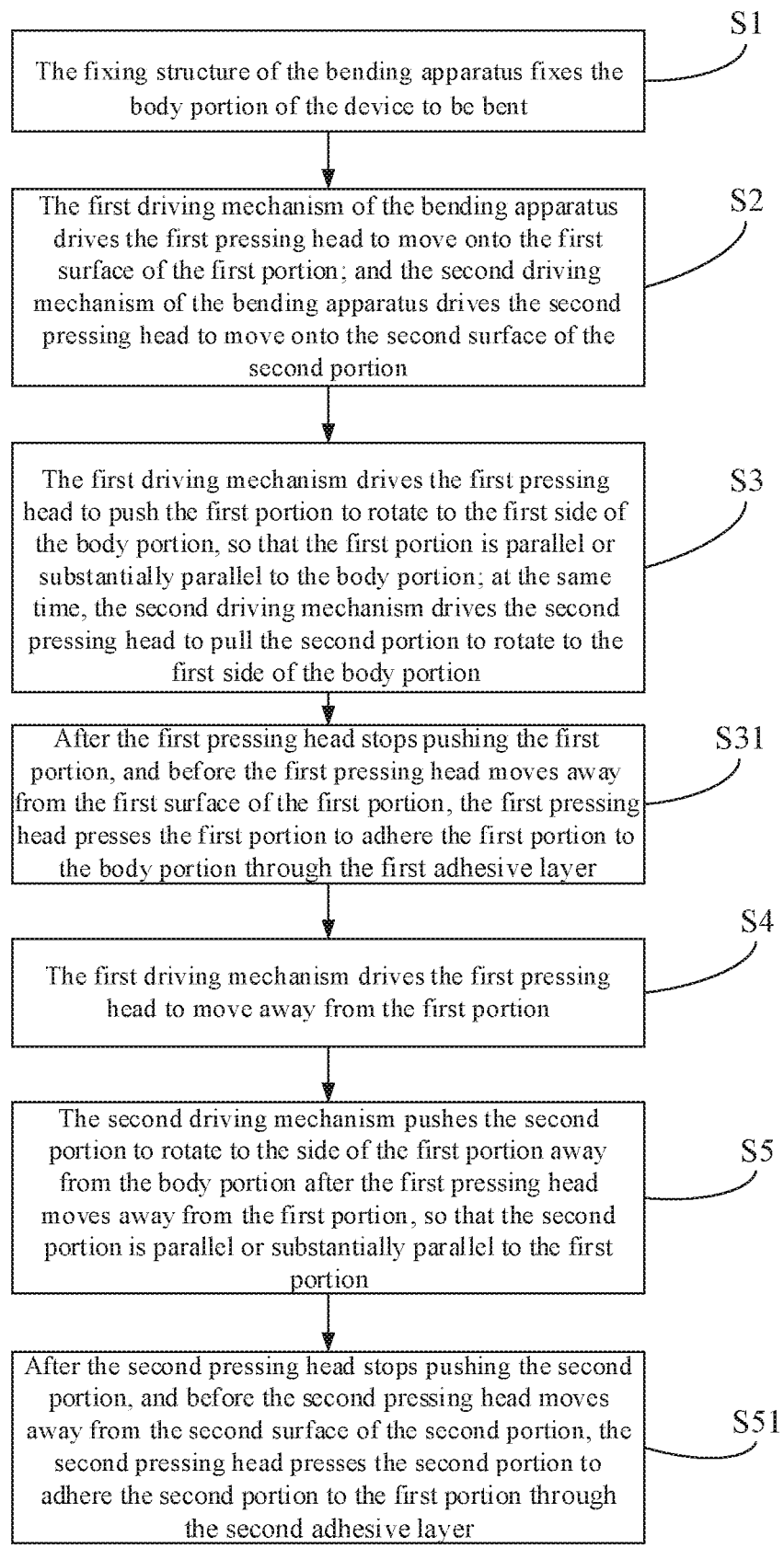
FIG. 18 is a flow diagram of yet another machining method, in accordance with some embodiments.

In some embodiments, as shown in FIG. 9, the device to be bent 200 further includes the first adhesive layer 205 located on the surface M1 of the body portion at the first side M. Based on this, referring to FIG. 18, the machining method further includes a following step.

In S31, after the first pressing head 3 stops pushing the first portion 203, and before the first pressing head 3 moves away from the first surface of the first portion 203, the first pressing head 3 presses the first portion 203, so that the first portion 203 is adhered to the body portion 201 through the first adhesive layer 205.

In this way, after bending, the first portion 203 is not easy to bounce away from the body portion, so that the distance between the bent first portion 203 and the body portion 201 after bending may be small, and the thickness of the bent device may be small.

In some embodiments, as shown in FIG. 10, the device to be bent 200 may include the second adhesive layer 206 located on the first surface S1' of the second portion 204. In this case, referring to FIG. 18, the machining method further includes a following step.

In S51, after the second pressing head 5 stops pushing the second portion 204, and before the second pressing head 5 moves away from the second surface S2 of the second portion 204, the second pressing head 5 presses the second portion 204, so that the second portion 204 is adhered to the first portion 203 through the second adhesive layer 206.

In this way, the second portion 204 is adhered to the first portion 203, so that the second portion 204 is not easy to bounce away from the body portion 201. After bending, the distance between the second portion 204 and the first portion 203 may be small, so that the thickness of the bent device is small.

Some embodiments of the present disclosure provide the bent device 200A, and the bent device 200A may be machined by using the machining method provided in any one of the above embodiments.

Figure 19:
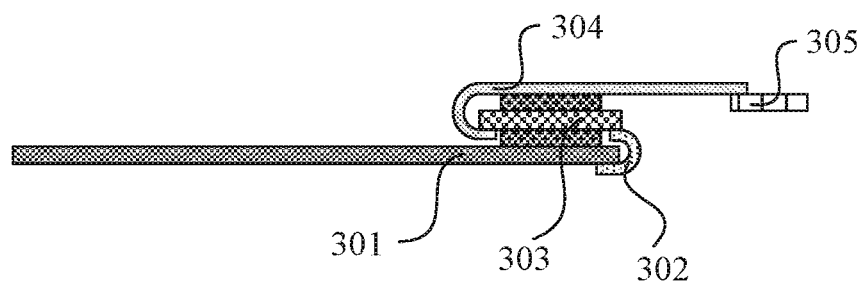
FIG. 19 is a structural diagram of a bent device, in accordance with some embodiments.

In some embodiments, the bent device 200A is a bent display module 300A. As shown in FIG. 19, the bent display module 300A includes a display panel 301, a COF (Chip On Film) circuit board 302, a printed circuit board 303, a flexible printed circuit 304 and a clock control circuit board 305. An end of the COF circuit board 302 is bonded to the display panel 301. An end of the printed circuit board 303 is bonded to another end of the COF circuit board 303. An end of the flexible printed circuit 304 is bonded to another end of the printed circuit board 303. An end of the clock control circuit board 305 is bonded to another end of the flexible printed circuit 304.

The display panel 301 is the body portion 201 of the device to be bent 200, the printed circuit board 303 is the first portion 203 of the device to be bent 200, and the flexible printed circuit 304 is the second portion 204 of the device to be bent 200. The first portion 203 is parallel or substantially parallel to the display panel 301, and the second portion 204 is parallel or substantially parallel to the first portion 203.

In the bent device 200A (e.g., the bent display module 300A) provided in some embodiments of the present disclosure, the clock control circuit board 305 is disposed on the end of the flexible printed circuit 304 away from the printed circuit board 303. Compared with the related art in which a clock control circuit board is disposed on a surface of a printed circuit board, the thickness of the bent device 200A (e.g., the bent display module 300A) provided in some embodiments of the present disclosure is small.

Figure 20:
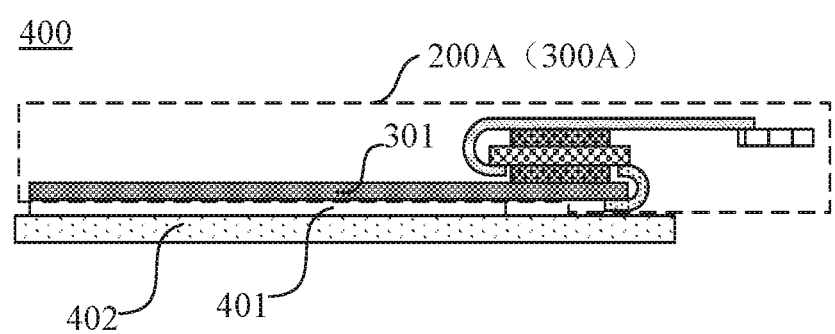
FIG. 20 is a structural diagram of a display device, in accordance with some embodiments.

As shown in FIG. 20, some embodiments of the present disclosure provide a display device 400. The display device 400 includes the bent device 200A provided in any one of the above embodiments. For example, as shown in FIG. 20, the bent device 200A may be the bent display module 300A.

The display device 400 may be any component with a display function, such as a television, a digital camera, a mobile phone, a watch, a tablet computer, a notebook computer, or a navigator.

Beneficial effects that can be achieved by the display device 400 provided in some embodiments of the present disclosure are the same as the beneficial effects that can be achieved by the bent device 200A provided in the above technical solutions, and will not be repeated here.

In a case where the bent device 200A is the bent display module 300A, for example, as shown in FIG. 20, the display device 400 may further include an optical adhesive 401 disposed on a second side of the display panel 301 in the bent display module 300A, and a cover plate 402 located on a side of the optical adhesive 401 away from the bent display module 300A. The optical adhesive 401 is configured to adhere the cover plate 402 to the display panel 301. The cover plate 402 may protect the display panel 301.

The foregoing descriptions are merely specific implementations of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A bending apparatus for machining a device to be bent, wherein the device to be bent includes a body portion and a portion to be bent connected to each other, and the portion to be bent includes a first portion and a second portion that are away from the body portion in sequence;
   the bending apparatus comprising:
   a fixing structure configured to fix the body portion of the device to be bent;
   a first driving mechanism and a first pressing head connected to the first driving mechanism; wherein the first driving mechanism is configured to drive the first pressing head to move onto a first surface of the first portion, and to drive the first pressing head to push the first portion to rotate to a first side of the body portion, so that the first portion is parallel or substantially parallel to the body portion; and
   a second driving mechanism and a second pressing head connected to the second driving mechanism; wherein the second drive mechanism is configured to drive the second pressing head to move onto a second surface of the second portion; wherein the second surface and the first surface are respectively located on two sides of the portion to be bent; wherein
   the second driving mechanism is further configured to drive the second pressing head to pull the second portion to rotate to the first side of the body portion while the first pressing head pushes the first portion.

2. The bending apparatus according to claim 1, wherein the second driving mechanism is further configured to drive the second pressing head to pull the second portion to rotate to the first side of the body portion while the first pressing head pushes the first portion, so that the second portion is perpendicular or substantially perpendicular to the body portion.

3. The bending apparatus according to claim 1, wherein the first driving mechanism is further configured to drive the first pressing head to move away from the first portion after the first portion is parallel or substantially parallel to the body portion.

4. The bending apparatus according to claim 3, wherein the second driving mechanism is further configured to drive the second pressing head to push the second portion to rotate to a side of the first portion away from the body portion after the first pressing head moves away from the first portion, so that the second portion is parallel or substantially parallel to the first portion.

5. The bending apparatus according to claim 1, wherein the first pressing head includes:
   a first adsorption plate, at least one first vacuum pumping hole being disposed in the first adsorption plate; and
   a first vacuum pumping device communicated with the at least one first vacuum pumping hole;
   and/or
   the second pressing head includes:
   a second adsorption plate, at least one second vacuum pumping hole being disposed in the second adsorption plate; and
   a second vacuum pumping device communicated with the at least one second vacuum pumping hole.

6. The bending apparatus according to claim 5, wherein
   in a case where the first pressing head includes the first adsorption plate and the first vacuum pumping device, the first pressing head further includes:
   a first pressing plate; and
   a first cylinder connected to the first pressing plate and configured to drive the first pressing plate to move towards or away from the first portion; wherein
   the device to be bent further includes a first adhesive layer located on a surface of the body portion at the first side; when the first pressing head stops pushing the first portion, and before the first pressing head moves away from the first portion, the first pressing plate is located on a side of the first portion away from the first adhesive layer, and an orthographic projection of the first pressing plate on the body portion is at least partially overlapped with an orthographic projection of the first adhesive layer on the body portion; the first cylinder is configured to drive the first pressing plate to move towards the first portion, so that the first portion is adhered to the body portion through the first adhesive layer;
   and/or
   in a case where the second pressing head includes the second adsorption plate and the second vacuum pumping device, the second pressing head further includes:
   a second pressing plate; and
   a second cylinder connected to the second pressing plate and configured to drive the second pressing plate to move towards or away from the second portion; wherein
   the device to be bent further includes a second adhesive layer located on a first surface of the second portion; when the second pressing head stops pushing the second portion, and before the second pressing head moves away from the second portion, the second pressing plate is located on a side of the second portion away from the second adhesive layer, and an orthographic projection of the second pressing plate on the body portion is at least partially overlapped with an orthographic projection of the second adhesive layer on the body portion; the second cylinder is configured to drive the second pressing plate to move towards the second portion, so that the second portion is adhered to the first portion through the second adhesive layer.

7. The bending apparatus according to claim 1, wherein the first driving mechanism includes:

a first base;

a first Y-axis movement mechanism disposed on the first base and including a first support structure capable of moving in a Y-axis direction relative to the first base;

a first Z-axis movement mechanism disposed on the first support structure and including a second support structure capable of moving in a Z-axis direction relative to the first support structure;

a first X-axis rotation mechanism disposed on the second support structure and including a first rotation structure capable of rotating about a rotation axis of the first rotation structure parallel to an X-axis direction relative to the second support structure; and a first rotation arm; wherein an end of the first rotation arm is connected to the first rotation structure, and another end of the first rotation arm is connected to the first pressing head; the first rotation arm is parallel to the rotation axis of the first rotation structure, and an axis of the first rotation arm and the rotation axis of the first rotation structure have a first preset distance therebetween;

and/or the second driving mechanism includes:

a second base;

a second Y-axis movement mechanism disposed on the second base and including a third support structure capable of moving in the Y-axis direction relative to the second base;

a second Z-axis movement mechanism disposed on the third support structure and including a fourth support structure capable of moving in the Z-axis direction relative to the third support structure;

a second X-axis rotation mechanism disposed on the fourth support structure and including a second rotation structure capable of rotating about a rotation axis of the second rotation structure parallel to the X-axis direction relative to the fourth support structure; and a second rotation arm; wherein an end of the second rotation arm is connected to the second rotation structure, and another end of the second rotation arm is connected to the second pressing head; the second rotation arm is parallel to the rotation axis of the second rotation structure, and an axis of the second rotation arm and the rotation axis of the second rotation structure have a second preset distance therebetween.

8. The bending apparatus according to claim 7, wherein the first rotation structure and the second rotation structure are respectively located on two opposite sides of the fixing structure in the X-axis direction; the first rotation arm extends to a side of the second rotation structure proximate to the fixing structure, and the second rotation arm extends to a side of the first rotation structure proximate to the fixing structure.

9. The bending apparatus according to claim 7, wherein the X-axis direction, the Y-axis direction and the Z-axis direction are perpendicular to each other, and the X-axis direction and the Y-axis direction are parallel to a horizontal plane.

10. The bending apparatus according to claim 1, wherein the fixing structure includes:

a carrier plate, a plurality of vacuum pumping holes being disposed in the carrier plate; and a third vacuum pumping device communicated with the plurality of vacuum pumping holes.

11. The bending apparatus according to claim 10, further comprising a third driving mechanism; wherein the third driving mechanism includes:

a third base; and a third Y-axis movement mechanism disposed on the third base and including a fifth support structure capable of moving in a Y-axis direction relative to the third base; wherein the carrier plate is disposed on the fifth support structure.

12. The bending apparatus according to claim 11, further comprising:

at least one blower disposed on the third base; wherein the at least one blower is configured to, before the first pressing head moves to the first surface of the first portion, and before the second pressing head moves to the second surface of the second portion, blow air to the portion to be bent, so that the portion to be bent and the body portion are located in a same plane or substantially in the same plane.

13. The bending apparatus according to claim 10, further comprising:

at least one support rod connected to the carrier plate; wherein the at least one support rod is configured to, before the first pressing head moves to the first surface of the first portion, and before the second pressing head moves to the second surface of the second portion, support the portion to be bent, so that the portion to be bent and the body portion are located in a same plane or substantially in the same plane.

14. A method of machining the device to be bent by using the bending apparatus according to claim 1, the method comprising:

fixing, by the fixing structure of the bending apparatus, the body portion of the device to be bent;

driving, by the first driving mechanism of the bending apparatus, the first pressing head to move onto the first surface of the first portion; and driving, by the second driving mechanism of the bending apparatus, the second pressing head to move onto the second surface of the second portion; wherein the second surface and the first surface are respectively located on the two sides of the portion to be bent; and driving, by the first driving mechanism, the first pressing head to push the first portion to rotate to the first side of the body portion, so that the first portion is parallel or substantially parallel to the body portion; at the same time, driving, by the second driving mechanism, the second pressing head to pull the second portion to rotate to the first side of the body portion.

15. The method according to claim 14, further comprising:

driving, by the first driving mechanism, the first pressing head to move away from the first portion; and pushing, by the second driving mechanism, the second portion to rotate to the side of the first portion away from the body portion after the first pressing head moves away from the first portion, so that the second portion is parallel or substantially parallel to the first portion.

16. The method according to claim 14, wherein the device to be bent further includes a first adhesive layer located on a surface of the body portion at the first side; the method further comprising:

after the first pressing head stops pushing the first portion, and before the first pressing head moves away from the first surface of the first portion, pressing, by the first pressing head, the first portion to adhere the first portion to the body portion through the first adhesive layer;

and/or the device to be bent further includes a second adhesive layer located on a first surface of the second portion; the method further comprising:

after the second pressing head stops pushing the second portion, and before the second pressing head moves away from the second surface of the second portion, pressing, by the second pressing head, the second portion to adhere the second portion to the first portion through the second adhesive layer.

17. A bent device, wherein the bent device is machined by the method according to claim 14.

18. The bent device according to claim 17, wherein the bent device is a bent display module; the bent display module includes:

a display panel;

a COF circuit board, an end of the COF circuit board being bonded to the display panel;

a printed circuit board, an end of the printed circuit board being bonded to another end of the COF circuit board;

a flexible printed circuit, an end of the flexible printed circuit being bonded to another end of the printed circuit board; and a clock control circuit board, an end of the clock control circuit board being bonded to another end of the flexible printed circuit;

wherein the display panel is the body portion of the device to be bent, the printed circuit board is the first portion of the device to be bent, and the flexible printed circuit is the second portion of the device to be bent; and the first portion is parallel or substantially parallel to the display panel, and the second portion is parallel or substantially parallel to the first portion.

19. A display device, comprising:

the bent device according to claim 17.

* * * * *